(12) United States Patent
Ooki et al.

(10) Patent No.: US 6,693,704 B1
(45) Date of Patent: Feb. 17, 2004

(54) WAVE SURFACE ABERRATION MEASUREMENT DEVICE, WAVE SURFACE ABERRATION MEASUREMENT METHOD, AND PROJECTION LENS FABRICATED BY THE DEVICE AND THE METHOD

(75) Inventors: Hiroshi Ooki, Tokyo (JP); Tomoya Noda, Tokyo (JP)

(73) Assignee: Nikon Corporation, Tokyo (JP)

( * ) Notice: Subject to any disclaimer, the term of this patent is extended or adjusted under 35 U.S.C. 154(b) by 335 days.

(21) Appl. No.: 09/670,013

(22) Filed: Sep. 26, 2000

(51) Int. Cl.$^7$ .................................. G01J 1/00
(52) U.S. Cl. ................ 356/121; 250/201.9; 356/124
(58) Field of Search ........................ 356/121, 122, 356/123, 124, 125, 126, 127; 250/201.9

(56) References Cited

U.S. PATENT DOCUMENTS

| | | | |
|---|---|---|---|
| 4,641,962 A | * 2/1987 | Sueda et al. | 356/124 |
| 4,979,819 A | * 12/1990 | Humbel et al. | 356/124 |
| 6,452,145 B1 | * 9/2002 | Graves et al. | 250/201.9 |

FOREIGN PATENT DOCUMENTS

| | | | |
|---|---|---|---|
| JP | 6-82229 | * 3/1994 | |
| JP | 06185997 | * 7/1994 | |
| JP | 10-284368 | 10/1998 | |

OTHER PUBLICATIONS

"An examination of an iterative method for the solution of the phase problem in optics and electron optics: I. Test calculates", D L Misell, J. Phys. D: Appl. Phys., vol. 6, 1973.
"Retrieval of wave aberration from point spread function or optical transfer data", Maeda et al., Applied Optics, vol. 20, No. 2, Jan. 15, 1981.

* cited by examiner

Primary Examiner—Hoa Q. Pham
(74) Attorney, Agent, or Firm—Oliff & Berridge, PLC

(57) ABSTRACT

A method and apparatus for measuring a wave front aberration of a projection lens with high precision and a related calibration method. The apparatus includes: either a light source and an element producing a first point source in combination with the light source or a first point source generating part; a magnifying projection optical system projecting and magnifying a point image of the first point source projected by a test object; a detector detecting the magnified point image projected and magnified by the magnifying projection optical system; a supporting member supporting the magnifying projection optical system and the detector; a calculating part calculating a wave front aberration; and either a second point source producing element or a second point source generating part.

14 Claims, 9 Drawing Sheets

WAVE SURFACE ABERRATION MEASUREMENT DEVICE, WAVE SURFACE ABERRATION MEASUREMENT METHOD, AND PROJECTION LENS FABRICATED BY THE DEVICE AND THE METHOD

BACKGROUND OF THE INVENTION

1. Field of the Invention

The present invention relates to an apparatus for measuring a wave front aberration, a method for measuring a wave front aberration using the apparatus, and a method for manufacturing a projection lens by using thereof.

2. Description of Related Art

Recently, a projection lens of a projection exposure apparatus has been required to have higher resolving power in order to cope with the recent improvement of the density and the minuteness of a semiconductor device.

An optical performance of a projection lens has been evaluated by a wave front aberration because the wave front aberration is the sole measure capable of foreseeing resolution of any pattern.

There are several methods for measuring a wave front aberration. Among them, a method that measures a wave front aberration by a phase retrieve method based on point-spread functions of an object at a focused position and a defocused position and known information has been proposed in following references: J. Maeda at al. *"Retrieval of wave aberration from point-spread function or optical transfer date"* Applied Optics vol. 20, p274–279, D. L. Misell *"An examination of an iterative method for solution of the phase problem in optics and electron optics"* Test calculations Journal of physics D: Applied Physics vol. 6, p2200–2216.

However, when an apparatus for measuring a wave front aberration is realized based on the theory, since it is impossible to directly detect the point-spread function by a CCD on account of limited number of pixels of the CCD, it is inevitable for the apparatus f or measuring a wave front aberration to have an magnifying projection optical system for magnifying the point-spread function.

In this case, it is necessary to eliminate aberrations of the magnifying projection optical system. Thus the aberrations of the magnifying projection optical system have to be measured. This is fit for calibration. In the phase retrieve method from a point image, calibration method for the apparatus has not been found out.

Moreover, deformation of a point image may be caused not only by a wave front aberration of a test lens but also by an unnecessary element caused by a construction of the point image. When the deformation of a point image includes other elements than the wave front aberration of the test lens, the wave front aberration of the test lens cannot be measured correctly.

FIG. 10 is a drawing showing a construction of an ordinary point source 71. The point source 71 is constructed by a pinhole 74 arranged on a shield film 73 formed on a glass substrate 72, a lamp 75 for illuminating the pin hole 74 with a parallel light L11 from the shield film 73 side, and an illumination lens 76.

In the point source 71, a light L12 passed through the pinhole 74 is exit as a measuring light L13 after passing through the glass substrate 72. Then, the light L13 is converged by a test lens (not shown), and forms a deformed point image (an image of the pinhole 74).

In this case, a light L12 just passed through the pin hole 74 is approximately a spherical wave. However, a light incident to the test lens (not shown) is the measuring light L13 affected with aberrations (spherical aberration and coma) caused by the glass substrate 72 while passing through the glass substrate 72. Accordingly, the point image obtained by converging the measuring light L13 inevitably includes deformation in accordance with aberrations caused by the glass substrate 72.

Further, the parallel light L11 illuminating the pinhole 74 has an angular divergence $\theta$ determined by the focal length of the illumination lens 76 and the aperture diameter d of the lamp 75. Since the angular divergence $\theta$ appears directly on an angular divergence $\psi$ of the measuring light L13 after passing through the glass substrate 72, the point image contains deformation in accordance with the angular divergence $\psi$ (which is equal to the angular dispersion $\theta$ of the parallel light L11) of the measuring light L13.

Furthermore, when a flare light L14 is incident to the pinhole 74, since an unnecessary light caused by the flare light 14 is mixed with the measuring light L13, deformation caused by the flare light 14 is added to the point image.

Thus when the wave front aberration of the test lens is measured by using the point source 71 having the construction shown in FIG. 10, deformation of the point image includes influence of unnecessary elements (aberrations in the glass substrate 72, an angular dispersion $\psi$ of the measuring light L13, a flare light L14), so that the wave front aberration of the test lens cannot be measured precisely.

Moreover, although influence of aberrations of the glass substrate 72 can be corrected after the calculation using the phase retrieve method, it has not been easy because the thickness and the inclination of the glass substrate 72 have to be measured precisely.

Further, although the influence of the angular dispersion $\psi$ of the measuring light L13 can be relieved by making the angular dispersion $\theta$ of the parallel light L11 smaller by using smaller aperture diameter d, it is not desirable that the light quantities of the parallel light L11 as well as the measuring light L13 decrease in correspondence with decrease in the aperture diameter d.

SUMMARY OF THE INVENTION

The present invention is made in view of the above-mentioned problems and has an object to provide a method and apparatus for measuring a wave front aberration of a projection lens with high precision and a calibration method of the apparatus for measuring a wave front aberration.

According to an aspect of the present invention, an apparatus for measuring a wave front aberration includes: either a light source and an element that produces a first point source in combination with the light source and that is removably or movably arranged or a first point source generating part; a holding mechanism that holds a test object; an magnifying projection optical system that projects and enlarges a point image of the first point source projected by the test object; a detector that detects the magnified point image projected and magnified by the magnifying projection optical system; a supporting member that supports the magnifying projection optical system and the detector and that can be moved along the optical axis and in a plane perpendicular to the optical axis; a calculating part that calculates a wave front aberration by means of a phase retrieve algorithm based on a point-spread function detected by the detector and known information input in advance; and either a second point source producing element that is removably or movably arranged and that produces a second point source on the image plane of the test object by means of the test object in combination with any one of the light source, the light source and the element, and the first point source generating part, or a second point source generating part that produces the second point source on the image plane of the test object and that is removably or movably arranged.

The point image of the first point source is projected by the test object in the image plane of the test object.

The image is deformed by the aberration of the test object relative to an ideal point image.

A point image which is further projected and magnified image by the magnifying projection optical system is further deformed by an aberration of the magnifying projection optical system.

Accordingly, the point image formed on the CCD includes the aberration of the test object superimposed by the aberration of the magnifying projection optical system.

Therefore, in order to measure the wave front aberration of only the test object, it is necessary that the aberration of only the magnifying projection optical system is measured first, and, then, the aberration of the test object and that of the magnifying projection optical system is subtracted by that of only the magnifying projection optical system.

At first, the second point source is generated in the image plane of the test object and, then, the aberration of only the magnifying projection optical system can be calculated by the phase retrieve algorithm based on the point-spread function formed by the detector via the magnifying projection optical system and known information.

In other words, since an ideal light from a point source is projected on the detector via the magnifying projection optical system, the point-spread function of the image contains the aberration of only the magnifying projection optical system.

According to another aspect of the present invention, an apparatus for measuring a wave front aberration includes: a point source that has a shield member and an illuminating member for illuminating a pinhole part made on the shield member from one side, and that emanates a measuring light from the other side of the pinhole part; a holding mechanism that holds a test lens; and a detector that detects the intensity distribution of the point image on the other side projected by the test lens; wherein the diameter of the pinhole part made on the shield member of the point source, facing to the one side illuminated by the illuminating member is larger than that on the other side emanating the measuring light.

DESCRIPTION OF THE PREFERRED EMBODIMENTS

An apparatus for measuring a wave front aberration according to embodiments of the present invention will be explained below with reference to the attached drawings.

<First Embodiment>

Figure 1:
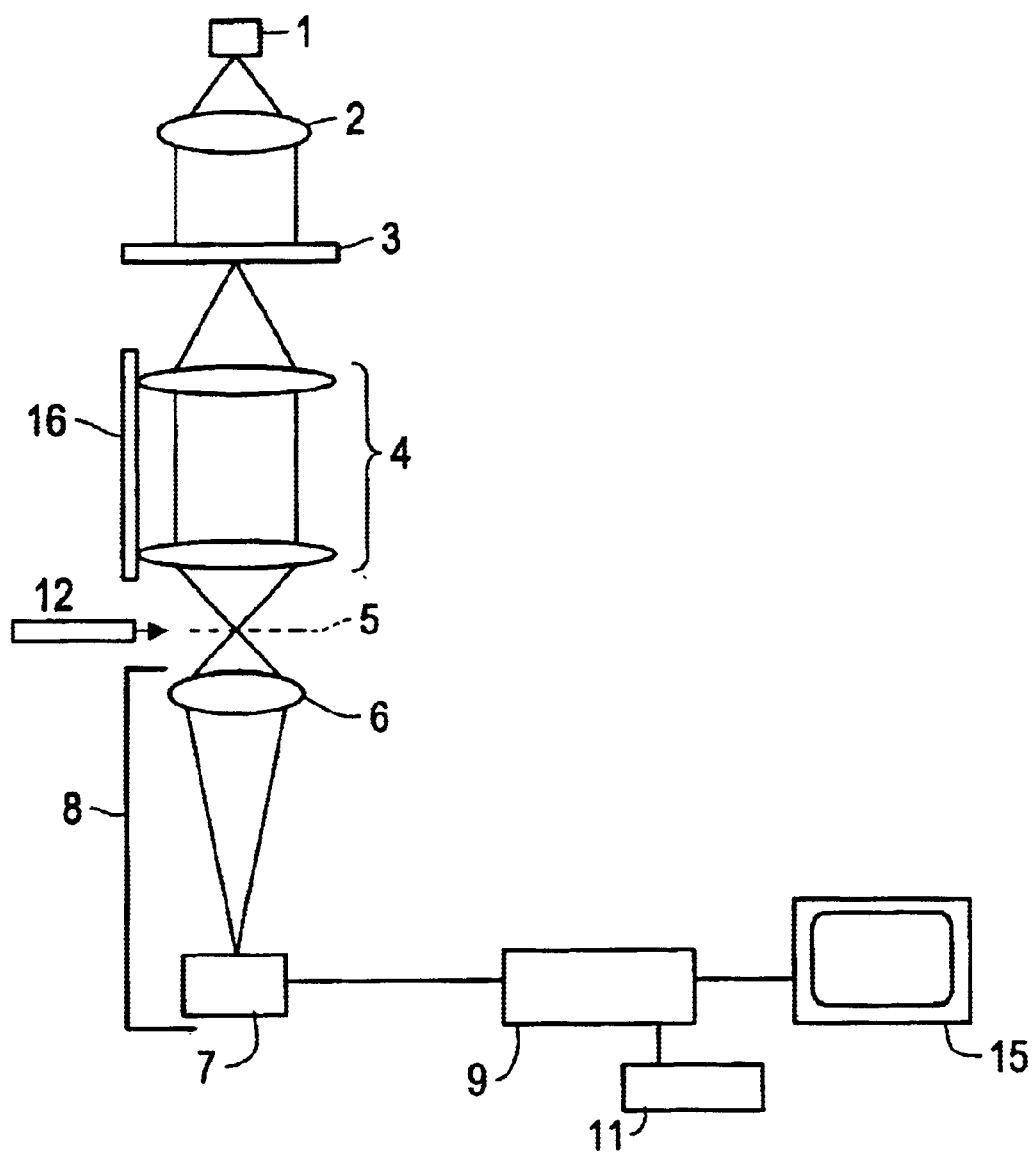
FIG. 1 is a diagram showing an outline of an apparatus for measuring a wave front aberration according to a first embodiment of the present invention.

FIG. 1 is a diagram showing an outline of an apparatus for measuring a wave front aberration according to a first embodiment of the present invention.

In FIG. 1, reference number 1 denotes a light source, 2 denotes an illumination optical system, 3 denotes a mask on which a pinhole is formed, 4 denotes a test object, 6 denotes an magnifying projection optical system, 7 denotes a CCD, 8 denotes a supporting member, 9 denotes a computer, 11 denotes a memory, 12 denotes a mask on which a pinhole is formed and having a moving mechanism (in x, y, and z direction) which is not shown, and 15 denotes a display.

In the apparatus for measuring a wave front aberration according to the first embodiment of the present invention, a light emanated from the light source 1 illuminates the mask 3 on which the pinhole is formed via the illumination optical system 2. This part as a whole plays a part for generating a point source (a first point source).

The diameter of a pinhole formed on the mask 3 is preferably smaller than $\lambda_1/NA_T$ where $NA_T$ denotes the numerical aperture of the test object 4 to the mask 3 side and $\lambda_1$ denotes a wavelength of the light source. When the diameter of the pinhole exceeds $\lambda_1/NA_T$, the pupil of the test object 4 cannot be illuminated uniformly, and, moreover, angular distribution of the incident light to the illumination optical system affects to the illumination condition.

However, a means for generating the first point source is not limited to this, a first point source generating part other than this can be preferably used for this purpose.

As for the first point source generating part, a single mode optical fiber connected to a laser light source can be mentioned. A laser light exit from a single mode optical fiber does not include any wave front aberration.

In order to prevent a substrate from generating aberrations, a shielding film with a pinhole, for example, metallic film such as chromium, or the like is formed on a surface of a transparent substrate as a mask 3. The mask 3 is arranged such that a transparent substrate is facing to incident side.

A light diffracted by the pinhole formed on the mask 3 forms a point image on the image plane 5 of the magnifying projection optical system 6 after passing through the test object (projection lens) 4.

The image plane 5 is optically conjugate with the mask 3.

Moreover, the point image is formed an magnified point image on the CCD 7 by the magnifying projection optical system 6 and, then, the intensity distribution of the magnified point image is detected by the CCD 7.

The magnifying projection optical system 6 and the CCD 7 are supported by the supporting member 8 constructed in a body and a point image in a defocusing state can be formed on the CCD 7 by moving the supporting member 8 in the Z direction.

The information of the point-spread function detected by the CCD 7 is transmitted to the computer 9.

Information such as a wavelength ($\lambda_1$) of the light source 1, a numerical aperture ($NA_T$) of the test object (projection lens) 4, a pupil shape of the test object 4, a wavelength of a second point source generating part, which is explained later, (hereinafter, called known information), and the well-known phase retrieve algorithm is input in the computer 9 in advance.

As for the well-known phase retrieve algorithm, we can use one mentioned in a literature such as J. Maeda et al. "*Retrieval of wave aberration from point-spread function or optical transfer date*" Applied Optics vol. 20, p274–279, D. L. Misell "*An examination of an iterative method for solution of the phase problem in optics and electron optics*" Test calculations Journal of physics D: Applied Physics vol. 6, p2200–2216.

Accordingly, a wave front aberration is calculated in the computer 9 based on information of the point-spread function in the state of in focus and a plurality of out of focus states by using the phase retrieve algorithm.

Moreover, on performing calibration of the apparatus for measuring a wave front aberration, the mask 12 (not shown) is inserted by the moving mechanism. This is an element for generating a point source. The aforementioned light from the first point source passes through the test object 4, converges in the vicinity of the pinhole of the mask 12, and, as a result, a role of a point source is preformed as a whole (a second point source).

By the way, although when the second point source is to be generated, the mask 3 is not an indispensable element, a light from the light source 1 passes through the test object 4, converges in the vicinity of the pinhole of the mask 12, and, as a result, a role of a point source is performed as a whole.

The diameter of the pinhole formed on the mask 12 is preferably smaller than $\lambda_2/NA_E$ where $NA_E$ denotes the numerical aperture of the magnifying projection optical system 6 to the mask 12 side and $\lambda_2$ denotes a wavelength of the light source. When the diameter of the pinhole exceeds $\lambda_2/NA_E$, the pupil of the magnifying projection optical system 6 cannot be illuminated uniformly, and, moreover, angular distribution of the incident light to the illumination optical system affects to the illumination condition.

A method for measuring a wave front aberration according to the first embodiment will be described below.

A wave front aberration of the test object is calculated by subtracting a second wave front aberration from a first wave front aberration described later.

First, the first wave front aberration is explained.

The test object 4 is arranged in a test-object holder 16 of an apparatus for measuring a wave front aberration according to the first embodiment, and a focusing position is arranged to the state of in focus by moving the supporting member 8 in the Z direction. The test object holder 16 is shown in block form and may be any known type of object holder.

The point-spread function in the state of in focus is measured by the CCD 7.

The information of the point-spread function is transmitted from the CCD 7 to the computer 9.

The state of in focus is changed to the state of out of focus by moving the supporting member 8 in the Z direction.

The point-spread function in the state of out of focus is measured by the CCD 7.

The information of the point-spread function is transmitted from the CCD 7 to the computer 9.

In the same way, the point-spread function in the other state of out of focus is measured a plurality of times.

A wave front aberration is calculated based on the information of the point-spread functions in the state of in focus and a plurality of times of out of focus by repeating calculation using the well-known phase retrieve algorithm (the value is the first wave front aberration).

The measurement of the point-spread function is preferably performed more than three positions on the optical axis including in the state of in focus and out of focus.

Furthermore, in order to measure wave front aberrations on the important positions within the angle of view of the test object 4, the mask 3 is moved in a stepping manner by a predetermined amount in the direction perpendicular to the optical axis, and the wave front aberration in each position is measured.

Since the position of the image moves in accordance with this, the magnifying projection optical system 6 and the detector 7 is to be moved by moving the supporting member 8 in the X and Y directions.

In the projection exposure apparatus, this is a necessary step for the wave front aberration of the illumination area to keep within a standard value in order to illuminate a predetermined area of the photomask and to form a predetermined pattern on the wafer with high precision by the projection lens.

Then, a calibration method of the apparatus for measuring a wave front aberration will be explained (a second method for measuring a wave front aberration).

In this case, the position of the pinhole is made agree with focal point of the test object on the optical axis.

Accordingly, the second point source generating part is formed.

A focus position is arranged to the state of in focus by moving the supporting member 8 in the Z direction.

An image of the second point source is formed on the image plane of the magnifying projection optical system 6, which is the CCD 7.

The point-spread function in the state of in focus is measured by the CCD 7.

The information of the point-spread function is transmitted from the CCD 7 to the computer 9.

The state of in focus is changed to the state of out of focus by moving the supporting member 8 in the Z direction.

The point-spread function in the state of out of focus is measured by the CCD 7.

The information of the point-spread function is transmitted from the CCD 7 to the computer 9.

In the same way, the point-spread function in the other state of out of focus is measured a plurality of times.

A wave front aberration is calculated based on the information of the point-spread functions in the state of in focus and a plurality of times of out of focus by repeating calculation using the well-known phase retrieve algorithm (the value is the second wave front aberration).

<Second Embodiment>

Figure 2:
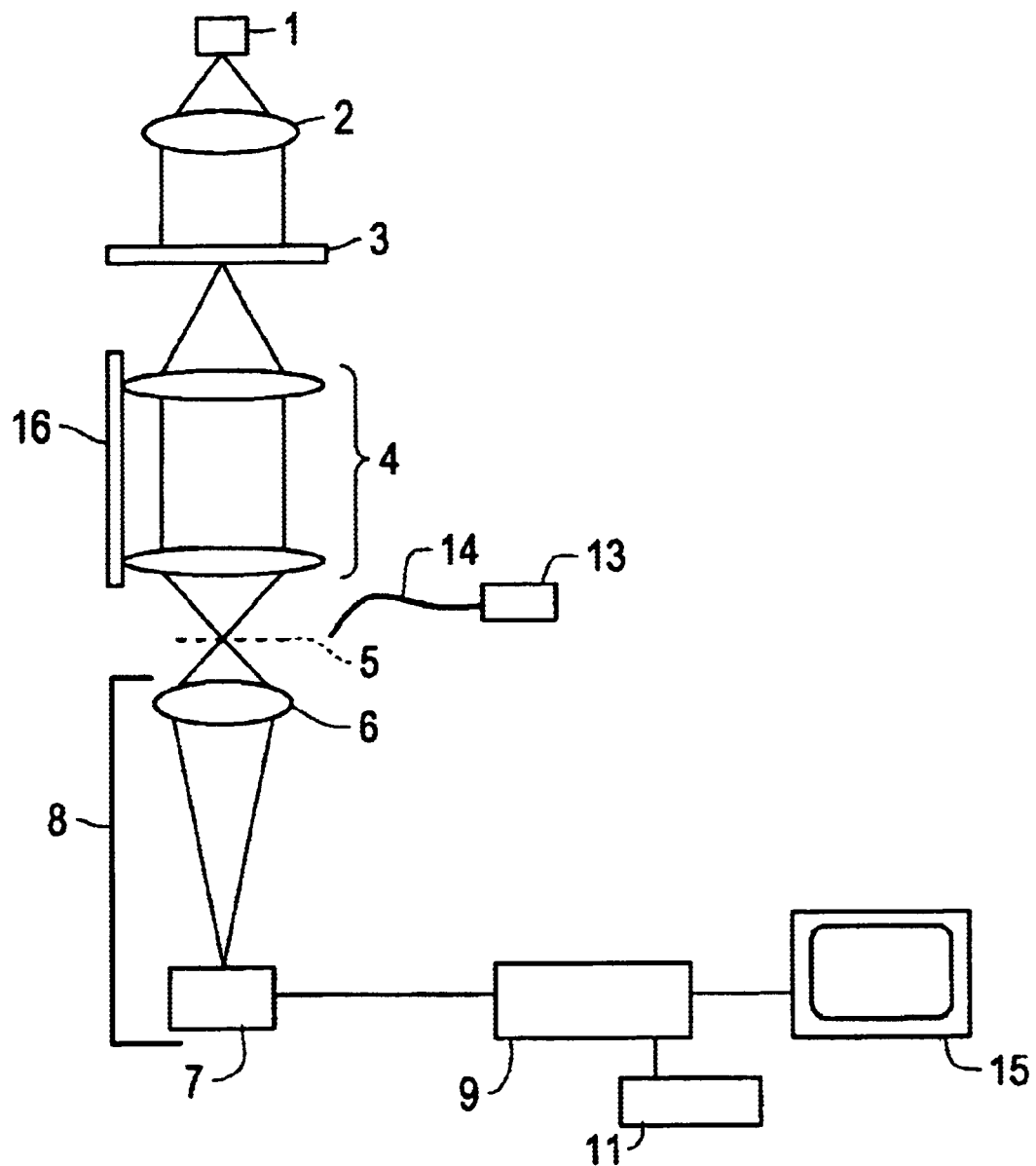
FIG. 2 is a diagram showing an outline of an apparatus for measuring a wave front aberration according to a second embodiment of the present invention.

FIG. 2 is a diagram showing an outline of an apparatus for measuring a wave front aberration according to a second embodiment of the present invention.

The apparatus for measuring a wave front aberration according to a second embodiment has a construction having the moving mechanism according to the first embodiment, and having a single mode optical fiber 14 equipped with a laser light source 13 instead of the mask 12 on which a pinhole is formed. The wavelength of the laser light source 13 is necessary to be approximately equal to that of the light source 1.

On performing calibration, the light source 1 is put off and the laser light source 13 is put on.

The exit laser beam from the single mode optical fiber 14 does not include any wave front aberration.

The single mode optical fiber 14 equipped with a laser light source 13 becomes the second point source generating part.

Moreover, the exit surface of the optical fiber 14 is arranged on the image plane 5 of the test object 4. The spot size of the laser beam is selected to be smaller than $\lambda_2/NA_E$ where $NA_E$ denotes the numerical aperture of the magnifying projection optical system 6 to the image plane 5 (image plane of the test object) side and $\lambda_2$ denotes a wavelength of the laser light source 13.

The reason why the spot size is made to be smaller than $\lambda_2/N_E$ is to uniformly illuminate the pupil of the magnifying projection optical system 6.

When the spot size exceeds $\lambda_2/NA_E$, the pupil of the magnifying projection optical system 6 cannot be illuminated uniformly.

A condenser optical system for converging the light from the laser light source 13 onto the image plane 5 can be arranged instead of the single mode optical fiber 4.

In this case, the real wave front aberration of the magnifying projection optical system is the value that the wave front aberration of the magnifying projection optical system measured while performing calibration is subtracted by that of the condenser optical system corrected its numerical aperture.

Furthermore, when the wave front aberration of the condenser optical system is not known, a mask on which a pinhole is formed may be arranged at the focal point of the condenser optical system.

The method for manufacturing a projection lens is explained below.

A wave front aberration of a projection lens is measured by the apparatus for measuring a wave front aberration according to the first or second embodiment of the present invention. A projection lens whose wave front aberration is not satisfied with the predetermined value is readjusted, and measured its wave front aberration. This process is repeated until the wave front aberration has been satisfied with the predetermined value. Thus, a projection lens with high precision can be manufactured.

<Third Embodiment>

Figure 3:
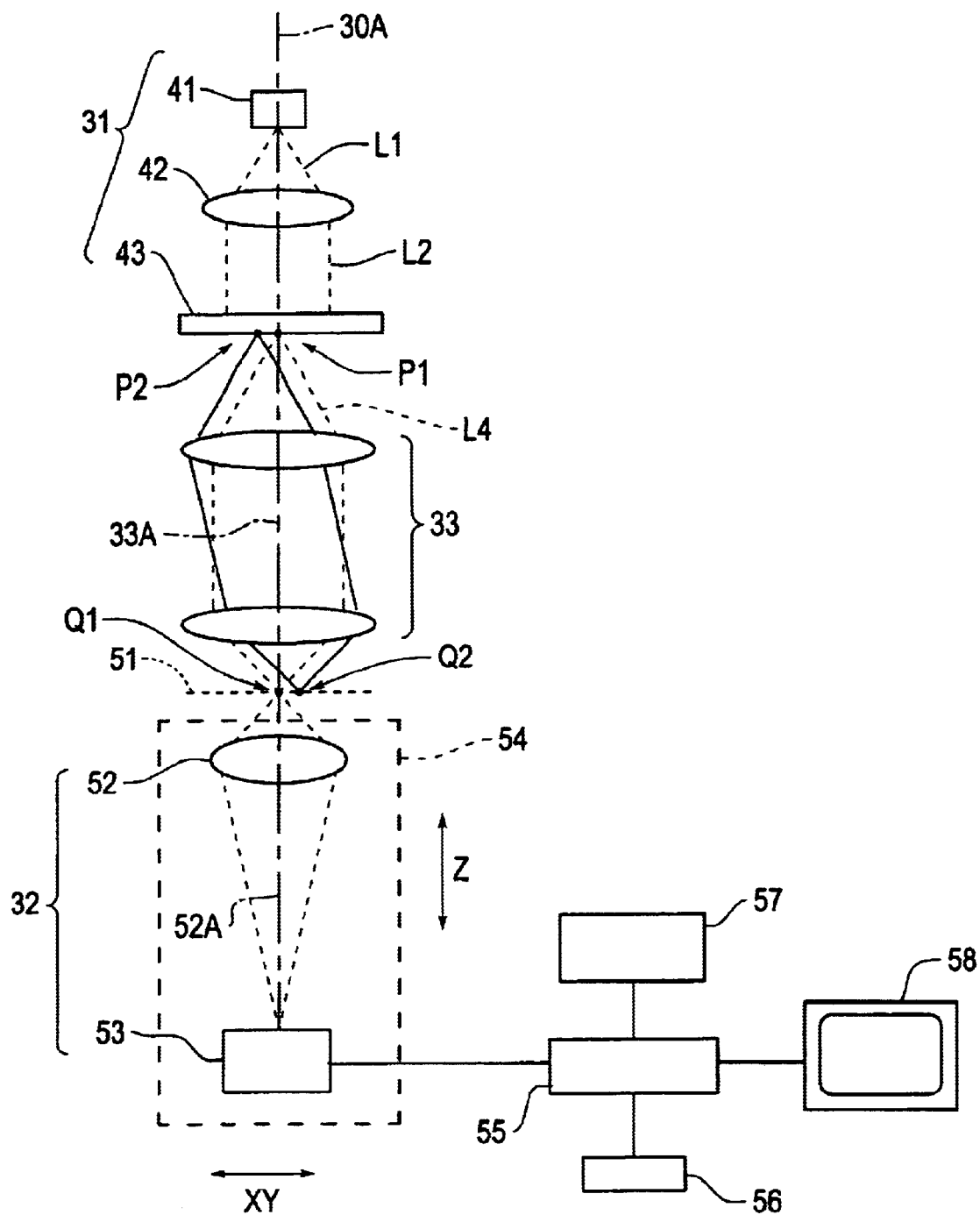
FIG. 3 is a diagram showing an outline of an apparatus for measuring a wave front aberration according to a third embodiment of the present invention.

FIG. 3 is a diagram showing an outline of an apparatus for measuring a wave front aberration according to a third embodiment of the present invention.

An apparatus for measuring a wave front aberration 30 according to the third embodiment shown in FIG. 3 is constructed by a point source part 31 and an imaging part 32. A test lens 33 (for example, a projection lens in an exposure apparatus) is arranged between the point source part 31 and the imaging part 32 with aligning the optical axis 33A of the test lens with the axis 30A of the apparatus 30.

The point source part 31 of the apparatus for measuring a wave front aberration 30 is constructed by a lamp 41, an illumination lens 42, and a mask 43.

The exit surface of the lamp 41 is located on the focal plane of the illumination lens 42. The optical axis of the illumination lens 42 is located on the axis 30A. These lamp 41 and illumination lens 42 are corresponding to "an illuminating member" in attached claim.

Figure 4:
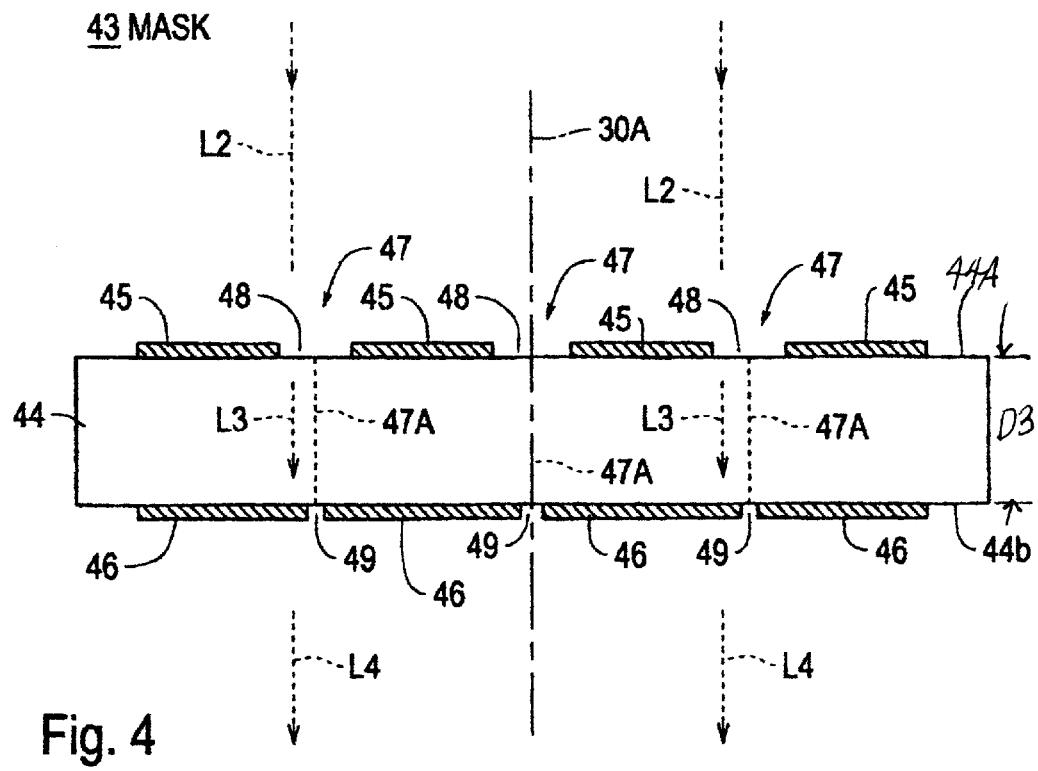
FIG. 4 is a sectional view showing a construction of a mask 43.

FIG. 4 is a sectional view showing a construction of a mask 43. The mask 43 (shield member) is constructed by a glass substrate 44 (transparent substrate) coated on both surfaces with thin metallic films 45, 46 (shield film with a thickness from 0.2 $\mu$m to 0.3 $\mu$m). One side of the metallic film 45 is formed on the illumination lens 42 side surface 44a of the glass substrate 44, and the other metallic film 46 is formed on the test lens 33 side surface 44b. The surfaces 44a and 44b on which the metallic films 45 and 46 are formed are perpendicular to the axis 30A.

Moreover, a plurality of pinhole parts 47 are formed on the mask 43 two-dimensionally within the effective visual field of the test lens 33. The plurality of pinhole parts are arranged, for example, in latticed or circular shape in accordance with an image point to be measured.

Although only three pinhole parts 47 are shown in FIG. 4, the practical number of pinhole part is from 50 to 100.

Figure 5A:
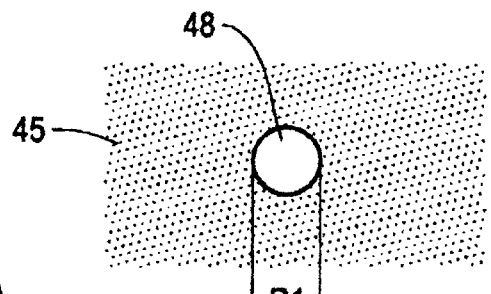
FIG. 5(A) is a top plan view of the mask 43.
Figure 5B:
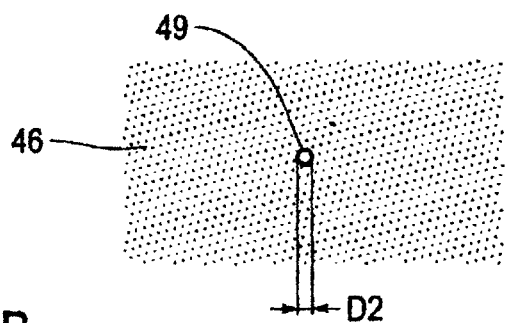
FIG. 5(B) is a bottom plan view of the mask 43.

FIGS. 5(A) and (B) are top and bottom plan views of the mask 43, respectively. In each pinhole part 47, the illumination lens 42 side is an aperture 48 shown in FIG. 5(A) formed on the metallic film 45 and the test lens 33 side is a pinhole 49 shown in FIG. 5(B) formed on the metallic film 46.

The aperture 48 and the pinhole 49 of the pinhole part 47 are arranged such that an axis 47A pausing through the center of the aperture 48 and that of the pinhole 49 is parallel to the axis 30A (which is the optical axis 33A of the test lens 33) of the apparatus for measuring a wave front aberration 30. The diameter D1 of the aperture 48 in FIG. 5(A) is larger than that D2 of the pinhole 49. By the way, the diameter D2 of the pinhole 49 is about 0.5 $\mu$m to 1.0 $\mu$m.

In FIG. 3, the imaging part 32 of the apparatus for measuring a wave front aberration 30 is composed of an magnifying lens 52 and a CCD imaging device 53 (detector). The magnification of the magnifying lens 52 is about 40 to 600 times. The CCD imaging device 53 is an area sensor having a plurality of pixels arranged two-dimensionally.

These magnifying lens 52 and CCD imaging device are supported by a supporting member 54 (driving member) in common, and can be moved in directions parallel (Z direction) and perpendicular (XY direction) to the axis 30A.

Further, a computer 55 (calculating member) is connected to the CCD imaging device 53 of the imaging part 32, a memory 56, an input member 57, and a display 58.

In the apparatus for measuring a wave front aberration 30 of the above-described construction shown in FIG. 3, a light beam L1 emitted from the lamp 41 illuminates the mask 43 with approximately parallel light (illumination light L2) after passing through the illumination lens 42. In this case, each pinhole part 47 of the mask 43 is illuminated by the illumination light L2 from the aperture 48 side as shown in FIG. 4. By the way, in FIGS. 3 and 4, only a light path exit from the center (on the axis 30A) of the lamp 41 is shown.

The illumination light L2 passed through each aperture 48 is led from the surface 44a of the glass substrate 44 to the inside, and reaches the other side surface 44b after passing through the glass substrate 44. Then, the light L3 arrived at the other side surface 44b illuminates the pinhole 49, and a light passed through each pinhole 49 becomes an exit light as a measuring light L4.

The measuring light L4 exit from each pinhole 49 is converged by the test lens 33 as shown in FIG. 3. At this moment, a plurality of images (point images) of the pinhole 49 are formed on the image plane 51 of the test lens 33. The positions of the plurality of the point images (images of the pinhole 49) in the image plane 51 are corresponding to the positions of the plurality of the pinholes 49 of the mask 43.

Incidentally, in FIG. 3, the light path (dotted line) of the measuring light L4 exit from the pinhole 49 located at the center P1 (on the axis 30A) of the mask 43 and the light path (solid line) of the measuring light L4 exit from the pinhole 49 located at P2 of the mask 43, which is off the center P1. The image of the pinhole 49 located at the center P1 of the mask 43 is formed at the center Q1 of the image plane 51. The image of the pinhole 49 located at P2 of the mask 43 is formed at Q2 away from the center Q1 of the image plane 51.

Next, each point image (image of the pinhole 49) formed on the image plane 51 of the test lens 33 is being considered. As described above, since each point image is obtained from the measuring light L4 formed by the test lens 33, each point image is inevitably deformed from ideal point image in consequence of a wave front aberration of the test lens 33. Moreover, the deformation of each point image is liable to be affected not only by a wave front aberration of the test lens 33 but also by an unnecessary element caused by the construction of the point source part 31.

Figure 6:
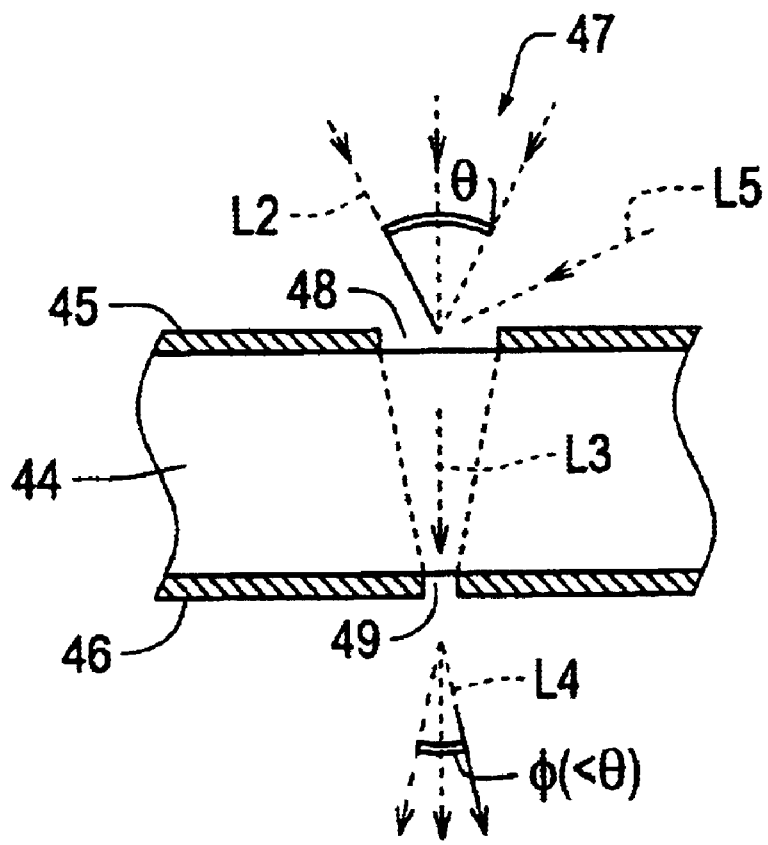
FIG. 6 is a sectional view explaining behavior of a light passing through a pinhole part 47 of the mask 43.

In the point source part 31, since an exit surface of the lamp 41 has a finite dimension, the illumination light. L2 illuminating the mask 43 has a well-known angular divergence θ defined by a diameter of the aperture of the lamp 41 and the focal length of the illumination lens 42 as shown in FIG. 6.

The illumination light L2 having the angular divergence θ is incident to the pinhole part 47 of the mask 43 from the aperture 48 side, and exit from the pinhole 49 side as the measuring light L4 after passing through the glass substrate 44.

The aperture 48 of the mask 43 has a larger diameter than the pinhole 49 (see FIGS. 4 and 5), and functions as an aperture stop, so that the angular divergence φ of the measuring light L4 exit from the pinhole 49 side of the pinhole part 47 is defined to smaller angular divergence than that θ of the illumination light L2. The angular divergence φ of the measuring light L4 is defined by the diameter D1 of the aperture 48, the diameter D2 of the pinhole 49, and the thickness D3 of the glass substrate 44 shown in FIGS. 4 and 5. Conditional expression is as follows:

$$\phi = \lambda_1 / NA_T + D_1 / D_3$$

where $\lambda_1$ denotes the wavelength of the measuring light L4, $NA_T$ denotes a numerical aperture to the mask 43 side of the test lens 33.

Thus, in the point source part 31 of this embodiment, since the angular divergence φ of the measuring light L4 can be small, the deformation of the point image (image of the pinhole 49) in accordance with the angular divergence φ of the measuring light L4 can be minimized. By the way, in the point source part 31, the angular divergence φ of the measuring light L4 can be small regardless of the angular divergence θ of the illumination light L2 Accordingly, the diameter of the aperture of the lamp 41 needs not to be small in order to make the angular divergence φ of the measuring light L4 smaller. Therefore, the light quantity of the measuring light can be secured.

Furthermore, even if a flare light L5 is incident to the aperture 48 of the pinhole part 47 from the side,f the unnecessary light caused by the flare light L5 can be blocked from mingling with the measuring light L4. Accordingly, the flare light LB does absolutely not affect to the deformation of the point image (image of the pinhole 49) that is converged image of the measuring light L4.

Moreover, since the light (roughly spherical wave) passed through the pinhole 49 of the pinhole part 47 is directly incident to the test lens 33 as a measuring light L4, the aberration caused by the glass substrate 44 does absolutely not affect to the deformation of the point image (image of the pinhole 49) as has been doing currently.

Thus, in the deformation of each point image(image of the pinhole 49) formed on the image plane 51 of the test lens 33, although the influence of the angular divergence φ of the measuring light L4 is slightly included, the influence of the aberration of the glass substrate 44 or the flare light L5 is absolutely not included. Therefore, it is understood that the deformation of each point image (image of the pinhole 49) is caused only by the influence of the aberration of the test lens 33.

For the reason mentioned above, a plurality of point images (image of the pinhole 49) deformed in response to the wave front aberration of the test lens 33 is formed on the image plane 51 of the test lens 33 in an arrangement (for example, Q1 or Q2) according to the position (for example, P1 or P2) of the pinhole 49 of the mask 43.

In this case, the deformation of each point image (image of the pinhole 49) formed at different position (for example, Q1 or Q2) on the image plane 51 is usually not same. The reason is that the deformation of the point image formed at the center Q1 of the image plane 51 corresponds to the wave front aberration of the test lens 33 in response to the image formation from the center P1 of the mask 43 to the center Q1 of the image plane 51. On the other hand, the deformation of the point image formed at Q2 of the image plane 51 corresponds to the wave front aberration of the test lens 33 in response to the image formation from the position P2 of the mask 43 to the position Q2 of the image plane 51.

Then, the method for obtaining the wave front aberration of the test lens 33 in response to the image formation from the center P1 of the mask 43 to the center Q1 of the image plane 51 is being explained.

In this case, the magnifying lens 52 and the CCD imaging device 53 are positioned at the XY position where the optical axis 52A of the magnifying lens 52 and the axis 30A overlap each other by the supporting member 54 as shown in FIG. 3. At this moment, the center Q1 of the image plane 51 is located at the center of the visual field of the magnifying lens 52. In the Z direction, the magnifying lens 52 and the CCD imaging device 53 are positioned at the in focus position where the object plane of the magnifying lens 52 and the image plane 51 overlap each other or at the out of focus position where the object plane of the magnifying lens 52 slightly slips from the image plane 51.

By this positioning, the point image (image of the pinhole 49) is magnified by the magnifying lens 52 and projected on the imaging plane of the CCD imaging device 53.

Then, the CCD imaging device 53 detects the light intensity distribution of the point image (image of the pinhole 49) formed at the center Q1 of the image plane 51. This detection of the light intensity distribution is performed. The of the light intensity distribution performed at the in focus position and the out of focus position are transmitted from the CCD imaging device 53 to the computer 55.

In computer 55, a repeating calculation using the phase retrieve method is performed based on the light intensity distribution (results of detection at the in focus position and the out of focus position) of the point image (image of the pinhole 49) formed at the center Q1 of the image plane 51 and the known information (the wavelength of the measuring light L4, numerical aperture of the test lens 33, shape of pupil, and the like).

As a result, the wave front aberration of the test lens 33 in response to the image formation from the center P1 of the mask 43 to the center Q1 of the image plane 51 is calculated. Thus, the obtained wave front aberration is input to the memory 56 and displayed on the display 58.

Figure 7:
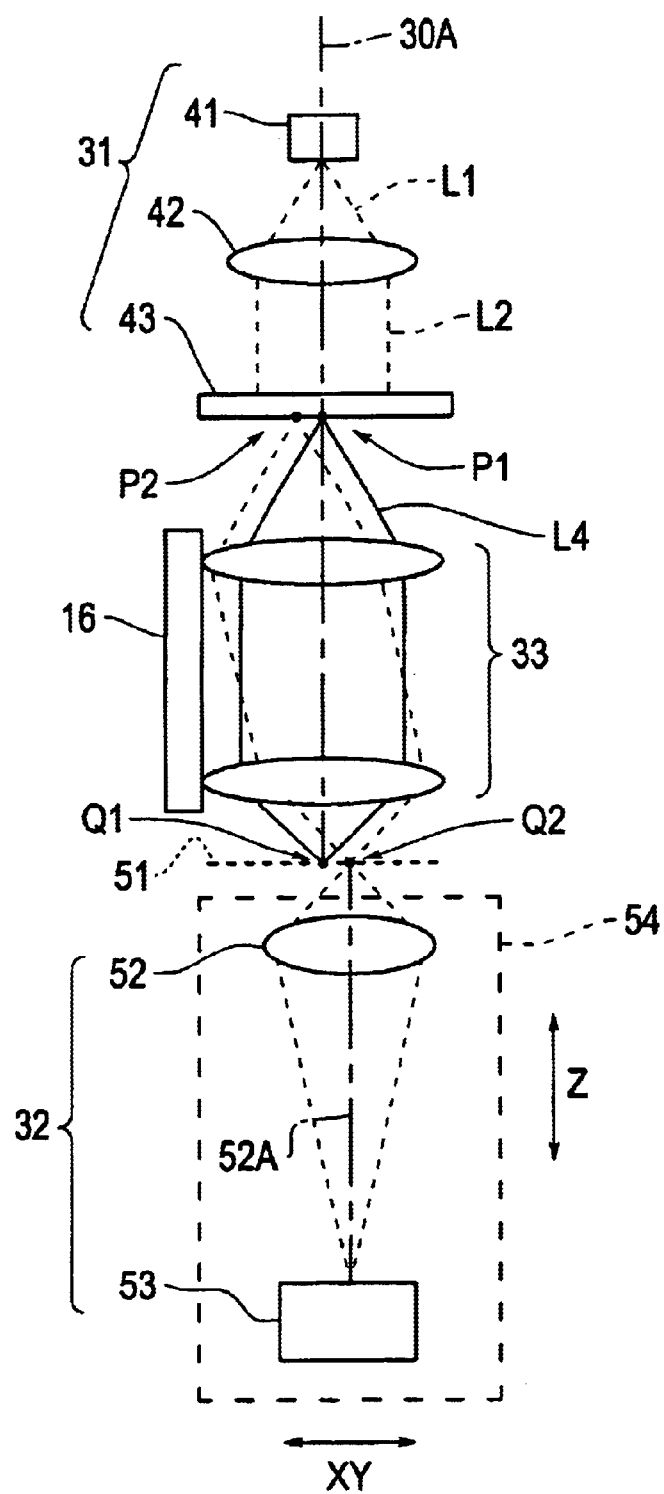
FIG. 7 is a diagram explaining behavior of the apparatus for measuring a wave front aberration 30.

Moreover, when the wave front aberration of the test lens 33 in response to the image formation from the position P2 of the mask 43 to the position Q2 of the image plane 51 is calculated, the magnifying lens 52 and the CCD imagine device 53 are moved in the XY direction by the supporting member 54, and positioned at the predetermined position as shown in FIG. 7. At this moment, the position Q2 of the image plane 51 is located at the center of the visual field of the magnifying lens 52. In the Z direction, the magnifying lens 52 and the CCD imagine device 53 are moved at the in focus position and the out of focus position as described above.

When positioned as shown in FIG. 7, the point image (image of the pinhole 49) formed at the position Q2 of the image plane 51 is magnified by the magnifying lens 52 and projected on the imaging plane of the CCD imaging device 53.

Then, the CCD imaging device 53 detects the light intensity distribution of the point image (image of the pinhole 49) formed at the position Q2 of the image plane 51. These detection of the light intensity distribution are performed at the in focus position and the out of focus position, and the results of the detection are transmitted from the CCD imaging device 53 to the computer 55.

In computer 55, a repeating calculation using the phase retrieve method is performed based on the light intensity distribution (results of detection at the in focus position and the out of focus position) of the point image (image of the pinhole 49) formed at the position Q2 of the image plane 51 and the known information (the wavelength of the measuring light L4, numerical aperture of the test lens 33, shape of pupil, and the like).

As a result, the wave front aberration of the test lens 33 in response to the image formation from the position P2 of the mask 43 to the position Q2 of the image plane 51 is calculated. Thus, the obtained wave front aberration is input to the memory 56 and displayed on the display 58.

In order to measure the wave front aberration of the test lens 33 in response to the image formation from the other positions of the mask 43 to the image plane 51, the above-mentioned procedure may be repeated. If the position to be measured is in the area where the pinhole part 47 can be located on the mask 43 and where the point image (image of the pinhole 49) can be formed on the image plane 51, the wave front aberration can be obtained by the similar procedure described above.

Thus, according to the apparatus for measuring a wave front aberration 30 of this embodiment, it can be considered that the deformation of each point image (image of the pinhole 49) formed on the image plane 51 is caused almost only by the influence of the wave front aberration of the test lens 33, so that the wave front aberration of the test lens 33 can be precisely obtained by the repeating calculation using the phase retrieve method.

Moreover, since a plurality of pinhole parts 47 are arranged on the mask 43, a plurality of point images (image of the pinhole 49) can be formed in the image plane 51 at a time, and wave front aberrations of the test lens 33 corresponding to a plurality of points can be easily measured by moving the imaging part 32 in the XY direction even if the test lens 33 has a wide effective visual field. As a result, the efficiency of the measurement can be enhanced.

Furthermore, since the wave front aberration of the test lens 33 can be measured with high speed, if the test lens 33 is a projection lens, an adjustment after assembly can be performed with high precision. As a result, a projection lens having very few remaining aberration with a high optical quality can be obtained.

By the way, although the diameter D2 of the pinhole 49 of the pinhole part 47 is made to be about 0.5 μm to 1.0 μm, the diameter D2 of the pinhole 49 is preferably smaller than $\lambda_1/NA_T$, where $\lambda_1$ denotes the wavelength of the measuring light L4 and $NA_T$ denotes numerical aperture of the teat lens 33 to the mask 43 side. When the diameter D2 satisfies this condition, the whole area of the pupil of the teat lens 33 can be uniformly illuminated by the measuring light L4 exit from the pinhole 49.

Further, in the embodiment described above, when the wave front aberration of the test lens 33 is measured, the wave front aberration of the test lens 33 is calculated based on the light intensity distribution of the point image (image of the pinhole 49) magnified and projected on the imaging plane of the CCD imaging device 53 by the magnifying lens 52 without considering the wave front aberration of the magnifying lens 52. Strictly speaking, the wave front aberration of the test lens 33 and the wave front aberration of the magnifying lens 52 are superimposed on the point image (image of the pinhole 49) formed on the CCD imaging device 53.

In order to obtain only the wave front aberration of the test lens 33, the wave front aberration of the magnifying lens 52 is measured first, and, then, the wave front aberration of the magnifying lens 52 may be subtracted from the measured result (that corresponds to the wave front aberration measured by the aforementioned embodiment) superimposed with both wave front aberrations.

Here, the measurement of the wave front aberration of the magnifying lens 52 is explained. In order to measure the wave front aberration of the magnifying lens 52 by using the apparatus for measuring a wave front aberration according to the aforementioned embodiment, a mask 61 (auxiliary shielding member) similar to the mask 43 is arranged on the image plane 51 of the test lens 33 as shown in FIG. 8(a).

Figures 8A, 8B:
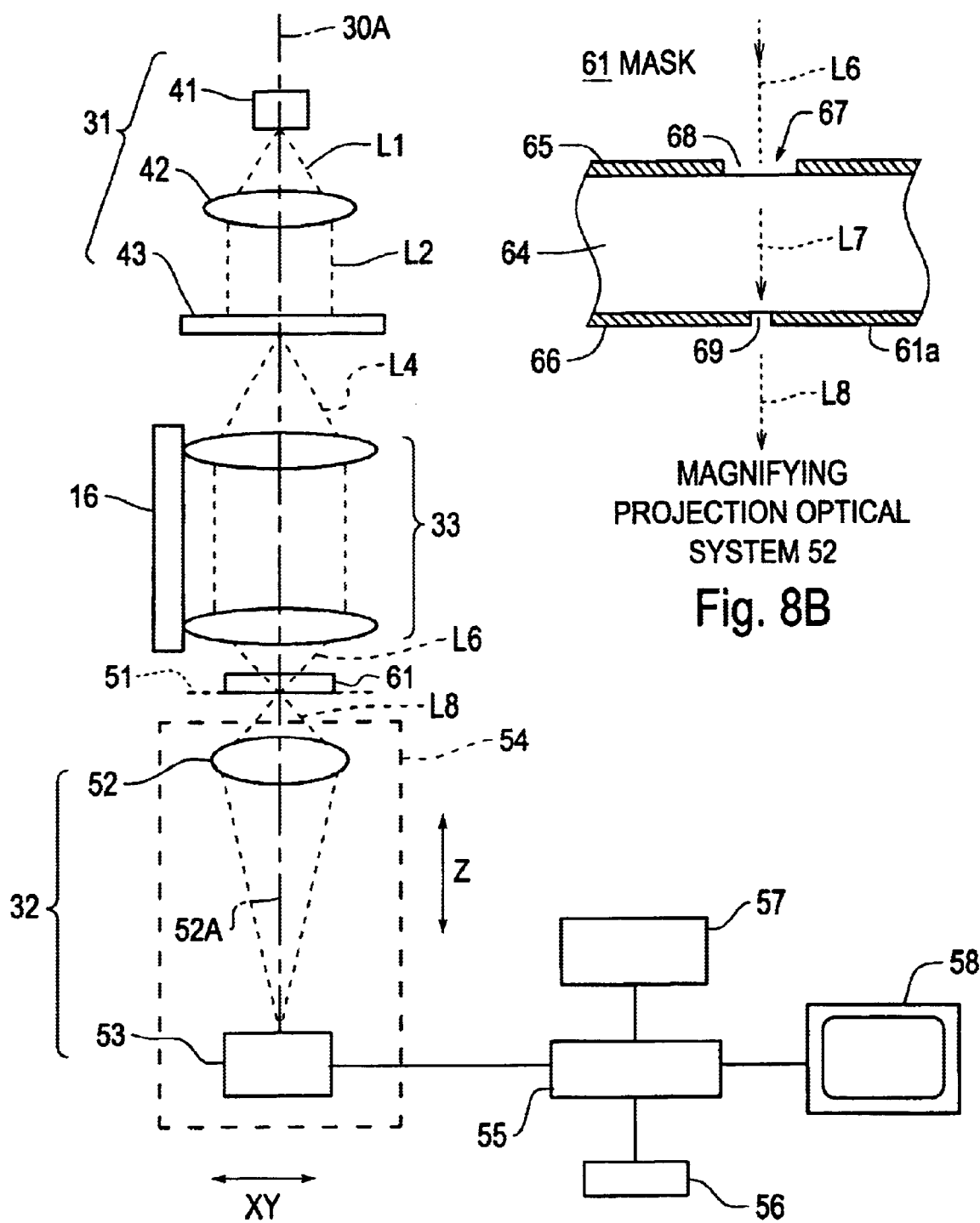
FIGS. 8(A) and (B) are drawings explaining a method for calibrating the apparatus for measuring a wave front aberration 30.

The mask 61 is constructed by a glass substrate 64 (transparent substrate) coated on both surfaces with thin metallic films 65, 66 (shield film with a thickness from 0.2 μm to 0.3 μm) as shown in FIG. 8(b). One side of the metallic film 65 is formed on the test lens 33 side surface of the glass substrate 64, and the other metallic film 66 is formed on the magnifying lens 52 side surface. The surfaces on which the metallic films 65 and 66 are formed are perpendicular to the axis 30A.

Moreover, one pinhole part 67 is arranged on the mask 61. In the pinhole part 67, an aperture 68 is arranged to the test lens 33 side on the metallic film 65, and a pinhole 69 is arranged to the magnifying lens 52 side on the metallic film 66. The aperture 68 and the pinhole 69 of the pinhole part 67 are arranged such that the axis passing through the center of the aperture 68 and that of the pinhole 69 coincides with the axis 30A (axis of the magnifying lens 52). The diameter of the aperture 68 is larger than that of the pinhole 69 (about 0.1 μm to 0.2 μm).

The mask 61 having this construction is arranged such that the pinhole side surface 61a coincides with the image plane 51 of the test lens 33. Therefore, the wave front aberration of only the magnifying lens 52 can be measured without being affected by the wave front aberration of the test lens 33.

The pinhole part 67 of the mask 61 is illuminated by a light L6 passed through the aperture 68 from the aperture 68 side. A light L7 passed through the aperture 68 passes through the inside of the glass substrate 64 and illuminates the pinhole 69 side. Then, a light passed through the pinhole 69 becomes the measuring light L8 (approximately spherical wave) and is exit from the pinhole 69. The light L8 passed through the pinhole 69 is converged on the imaging plane of the CCD imaging device 53 by the magnifying lens 52. At this time, images (point images) of the pinhole 69 are formed on the imaging plane of the CCD imaging device 53.

The point image (image of the pinhole 69) formed on the imaging plane of the CCD imaging device 53 are naturally deformed from an ideal point image by the influence of the wave front aberration of the magnifying lens 52. There is some possibility that the influence of an unnecessary element caused by the construction of the mask 61 is included into the deformation of the point image. However, it can be considered that the deformation of the point image (image of the pinhole 69) is mostly generated only by the influence of the wave front aberration of the magnifying lens 52 similar to the aforementioned result of the consideration regarding the mask 43.

The computer 55 performs the repeating calculation based on the light intensity distribution (detected result at in focus plane and out of focus plane) of the point image (image of the pinhole 69) input from the CCD imaging device 53 and the known information (wavelength of the measuring light L8, numerical aperture of the magnifying lens 52, shape of the pupil, and the like) by using the phase retrieve method. As a result, the wave front aberration of the center of the visual field of the magnifying lens is calculated. The wave front aberration of the magnifying lens 52 is also stored in the memory 56.

Accordingly, in the computer 55, the wave front aberration of only the test lens 33 is obtained by subtracting the wave front aberration of the magnifying lens 52 from the measured result (corresponding to the wave front aberration of the test lens 33 measured by the aforementioned embodiment) superposed by both wave front aberrations stored in the memory 56.

By the way, the diameter of the pinhole 69 of the pinhole part 67 is preferably smaller than $\lambda_2/NA_E$, where $\lambda_2$ denotes the wavelength of the measuring light L8 and $NA_E$ denotes numerical aperture of the magnifying lens 52 to the mask 61 side. When the diameter of the pinhole 69 satisfies the condition, the whole pupil of the magnifying lens 52 can be uniformly illuminated by the measuring light L8 exit from the pinhole 69.

Thus, the calibration of the apparatus for measuring a wave front aberration 30 can be easily performed by the method for inserting the mask 61 into the image plane 51 of the test lens 33. The wave front aberration of the test lens 33 can be measured with high precision even if the magnifying lens 52 attached to the apparatus for measuring a wave front aberration 30 has an intrinsic aberration.

Figure 9:
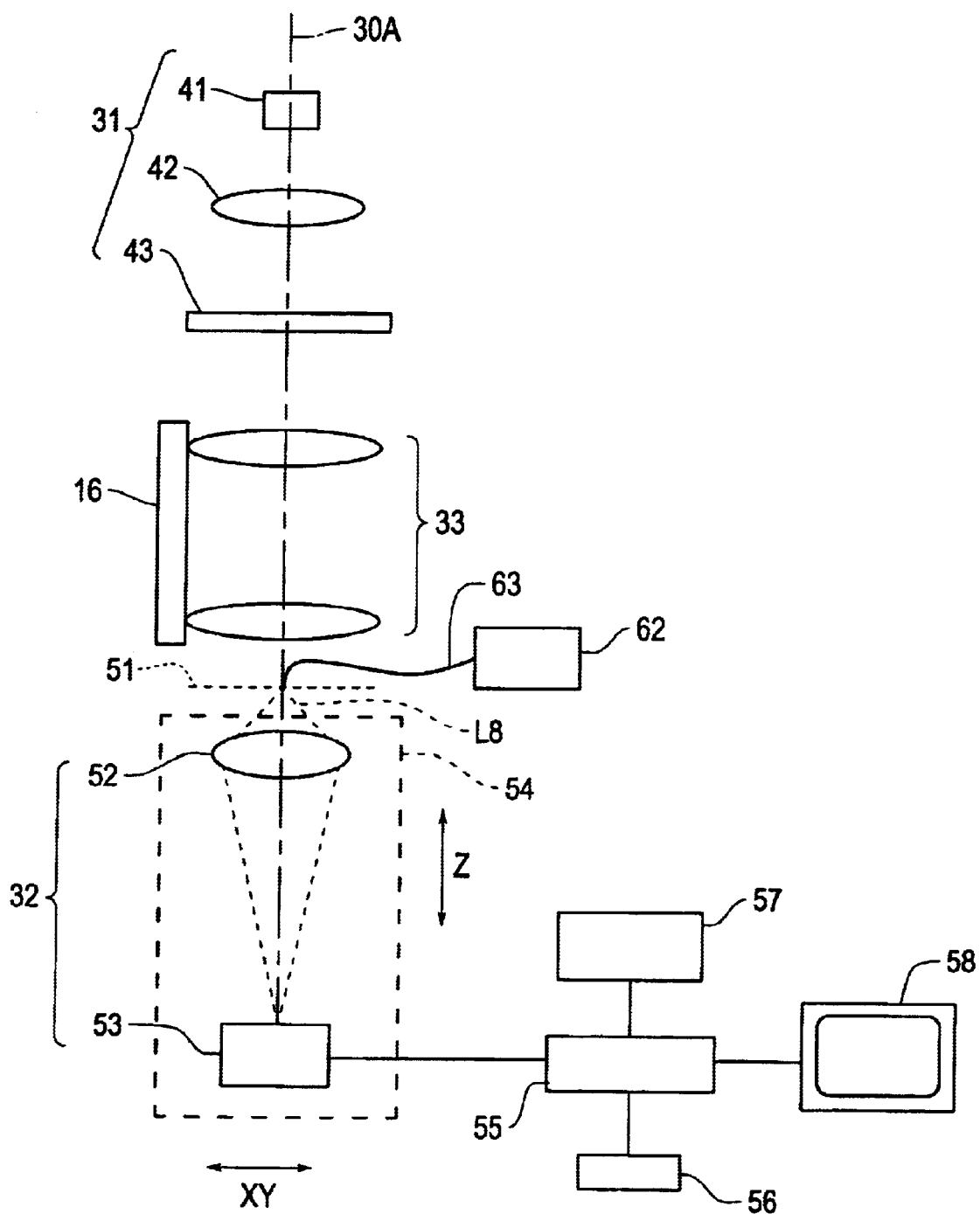
FIG. 9 is a drawing explaining another method for calibrating the apparatus for measuring a wave front aberration 30.
Figure 10:
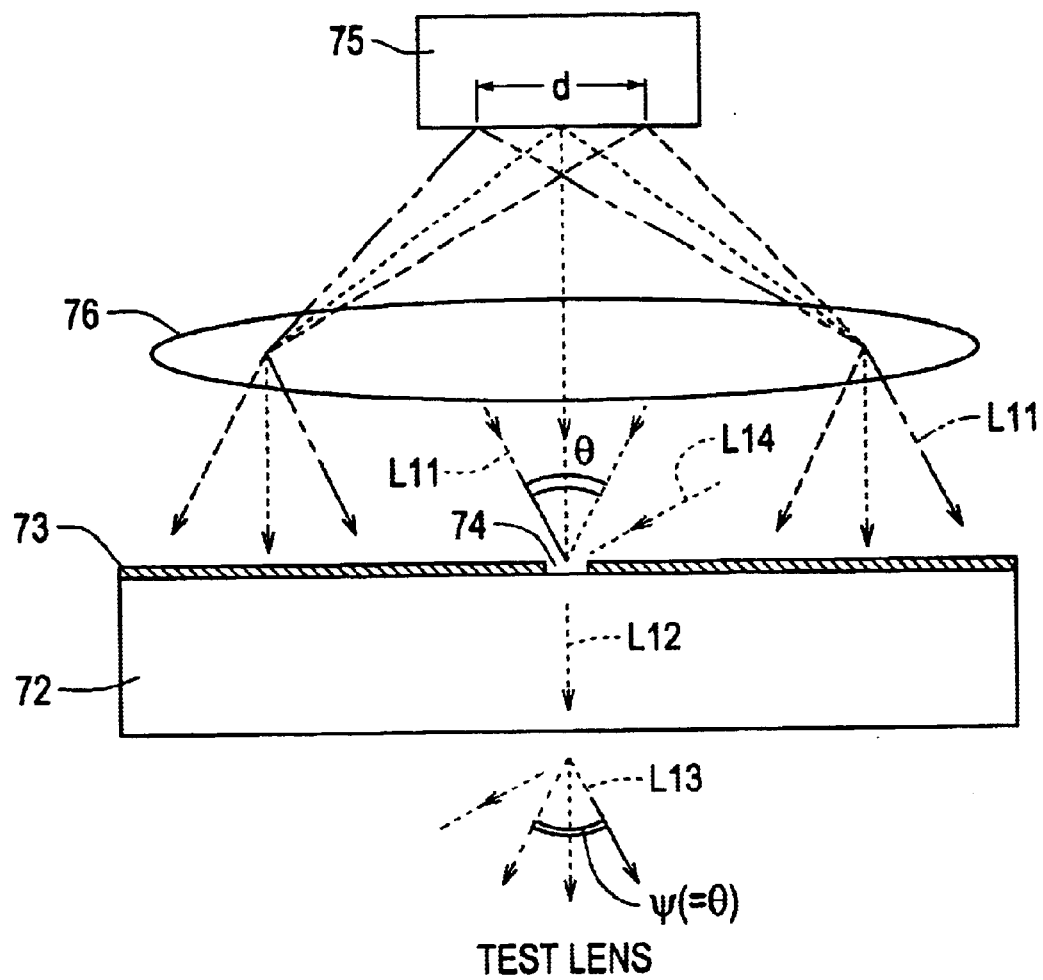
FIG. 10 is a drawing explaining a construction of a point source 71 according to prior art.

There is another method for calibrating the apparatus for measuring a wave front aberration 30. It is the method that a laser spot is used as the point source instead of the aforementioned mask 61 as shown in FIG. 9. In this case, the lamp 41 is put off. Then, a light (approximately same wavelength as the lamp 41) from a laser light source 62 is led to a single mode optical fiber 63. An exit surface of the single mode optical fiber 63 is arranged on the image plane 51 of the test lens 33. The diameter of the laser spot is preferably smaller than $\lambda_2/NA_E$, where $\lambda_2$ denotes the wavelength of the measuring light L8 and $NA_E$ denotes numerical aperture of the magnifying lens 52 to the exit surface side. In this case, the whole pupil of the magnifying lens 52 can be uniformly illuminated by the measuring light L8 exit from the exit surface of the optical fiber 63.

In order to converge the light from the laser light source 62, an ordinary optical system with an already-known wave front aberration can be used instead of the aforementioned optical fiber 63. In this case, the wave front aberration of the magnifying lens 52 can be obtained by subtracting that of the laser light converging optical system corrected its numerical aperture from that of the magnifying lens 52 measured while calibration. When the laser light is converged by an optical system whose wave front aberration is unknown, the mask 61 may be used at the converging point.

Although a few preferred embodiments of the present invention has been shown and described, it will be appreciated by those skilled in the art that changes may be made in these embodiments without departing from the principles and spirit of the invention, the scope of which is defined in the claims and their equivalents.

What is claimed is:

1. An apparatus for measuring a wave front aberration comprising:
   at least one of
   a light source and an element that produces a first point source in combination with the light source and that is removably/movably arranged
   and
   a first point source generating part;
   a holding mechanism that holds a test object;
   a magnifying projection optical system that projects and enlarges a point image of the first point source projected by a test object;
   a detector that detects the magnified point image projected and magnified by the magnifying projection optical system;
   a supporting member that supports the magnifying projection optical system and the detector and that can be moved along the optical axis and in a plane perpendicular to the optical axis;
   a calculating part that calculates a wave front aberration by means of a phase retrieve algorithm based on a point-spread function detected by the detector and known information input in advance; and
   at least one of
   a second point source producing element that is removably/movably arranged and that produces a second point source on the image plane of the test object by means of the test object in combination with any one of
   the light source,
   the light source and the element,
   the first point source generating part,
   and
   a second point source generating part that produces the second point source on the image plane of the test object and that is removably or movably arranged.

2. The apparatus for measuring a wave front aberration according to claim 1, wherein known information is:
   a numerical aperture of the test object;
   a shape of a pupil of the test object; and
   at least one of a wavelength of the light source,
   a wavelength of the first point source generating part, and
   a wavelength of the second point source generating part.

3. The apparatus for measuring a wave front aberration according to claim 1, wherein the point-spread function is a point-spread function where the focusing state of the test object is at least one of an in focus state and a plurality of out of focus states.

4. The apparatus for measuring a wave front aberration according to claim 1, wherein the second point source generating part is a mask having a pinhole.

5. The apparatus for measuring a wave front aberration according to claim 4, wherein a diameter of the pinhole is smaller than λ/NA, where NA denotes a numerical aperture of the magnifying projection optical system to a second light source side, and λ denotes a wavelength of at least one of the light source, the light source and the element, and the first point source generating part.

6. The apparatus for measuring a wave front aberration according to claim 1, wherein the second point source generating part is a single mode optical fiber connected with a light source.

7. The apparatus for measuring a wave front aberration according to claim 6, wherein a diameter of a laser spot at an exit surface of the optical fiber is smaller than λ/NA, where NA denotes a numerical aperture of the magnifying projection optical system to a second point source generating part side, and λ denotes a wavelength of the second point source generating part.

8. The apparatus for measuring a wave front aberration according to claim 1, wherein the detector is a two-dimensional CCD imaging device.

9. A projection lens measured, assembled, and adjusted by using the apparatus for measuring a wave front aberration according to claim 1.

10. A method for measuring a wave front aberration comprising steps of:
- a projecting step that projects a first point source in the vicinity of a image plane of a test object to form a point image by means of the test object;
- a magnifying and projecting step that further enlarges and projects the point image of the first point source onto a detector by a magnifying projection optical system;
- a first detecting step that detects the point-spread function of the magnified and projected point image on the detector;
- a first calculating step that calculates a first wave front aberration based on the point-spread function detected by the first detecting step and known information by using a phase retrieve method;
- a second point image generating step that generates a point image of a second point source on the image plane of the test object;
- a second magnifying and projecting step that enlarges and projects the point image of the second point source by the magnifying projection optical system onto the detector;
- a second detecting step that detects the point-spread function of the magnified and projected point image formed on the detector by the second magnifying and projecting step;
- a second calculating step that calculates a second wave front aberration based on the point-spread function detected by the second detecting step and known information by using the phase retrieve method; and
- a wave front aberration calculating step that calculates the wave front aberration of the test object by subtracting the second wave front aberration from the first wave front aberration.

11. The method for measuring a wave front aberration according to claim 10, wherein the known information is:
- a numerical aperture of the test object;
- a shape of a pupil of the test object; and
- at least one of a wavelength of the first point source, and a wavelength of the second point source.

12. The method for measuring a wave front aberration according to claim 10, wherein the point-spread function is measured in the state where the focusing state of the test object is at least one of an in focus state and a plurality of out of focus states.

13. A projection lens measured, assembled, and adjusted by using the method for measuring a wave front aberration according to claim 10.

14. An apparatus for measuring a wave front aberration and calculating a wave front aberration of a test object, comprising:
- a projector that projects a first point source in the vicinity of a image plane of a test object to form a point image by means of the test object;
- a magnifier and projector that further enlarges and projects the point image of the first point source onto a detector by an magnifying projection optical system;
- a first detector that detects the point-spread function of the magnified and projected point image on the detector;
- a first calculator that calculates a first wave front aberration based on the point-spread function detected by the first detector and known information by using a phase retrieve method;
- a second point image generator that generates a point image of a second point source on the image plane of the test object;
- a second magnifier and projector that enlarges and projects the point image of the second point source by the magnifying projection optical system onto the detector;
- a second detector that detects the point-spread function of the magnified and projected point image formed on the detector by the second magnifying and projecting step;
- a second calculator that calculates a second wave front aberration based on the point-spread function detected by the second detector and known information by using the phase retrieve method; and
- a wave front aberration calculator that calculates the wave front aberration of the test object by subtracting the second wave front aberration from the first wave front aberration.

* * * * *